(12) United States Patent
You

(10) Patent No.: US 7,070,831 B2
(45) Date of Patent: Jul. 4, 2006

(54) MEMBER FOR SEMICONDUCTOR PACKAGE AND SEMICONDUCTOR PACKAGE USING THE SAME, AND FABRICATION METHOD THEREOF

(75) Inventor: Joong-Ha You, Cheongju (KR)

(73) Assignee: Hyundai Electronics Industries Co., Ltd., Kyonggi-Do ( * ) Notice: Subject to any disclaimer, the term of this patent is extended or adjusted under 35 U.S.C. 154(b) by 0 days.

(21) Appl. No.: 10/330,202

(22) Filed: Dec. 30, 2002

(65) Prior Publication Data

US 2003/0102548 A1 Jun. 5, 2003

Related U.S. Application Data

(63) Continuation of application No. 09/324,780, filed on Jun. 3, 1999, now Pat. No. 6,521,979.

(30) Foreign Application Priority Data

Oct. 14, 1998 (KR) .................................. 98-42974

(51) Int. Cl.
*H01L 23/48* (2006.01)
*H01L 23/52* (2006.01)
*H01L 29/40* (2006.01)
*B05D 5/12* (2006.01)
*E01C 5/128* (2006.01)

(52) U.S. Cl. ...................... 427/131; 427/138; 427/337; 257/758

(58) Field of Classification Search ............ 228/180.22
See application file for complete search history.

(56) References Cited

U.S. PATENT DOCUMENTS 5,108,825 A * 4/1992 Wojnarowski et al. ...... 428/209
5,148,266 A * 9/1992 Khandros et al. ........... 257/773
5,157,589 A * 10/1992 Cole et al. .................. 361/795
5,477,611 A 12/1995 Sweis et al. .................. 29/840
5,493,151 A 2/1996 Asada et al. ................ 257/686
5,848,466 A 12/1998 Viza et al.
5,969,947 A 10/1999 Johnson et al.
6,043,125 A 3/2000 Williams et al.
6,054,767 A 4/2000 Chia et al.
6,093,971 A 7/2000 Oppermann et al.
6,097,098 A 8/2000 Ball
6,265,759 B1 * 7/2001 DiStefano et al. .......... 257/666
6,359,236 B1 * 3/2002 DiStefano et al. .......... 174/261

FOREIGN PATENT DOCUMENTS

JP 58-15251 1/1983
JP 58015251 A * 1/1983

* cited by examiner

*Primary Examiner*—David E. Graybill
(74) *Attorney, Agent, or Firm*—Fleshner & Kim, LLP

(57) ABSTRACT

A member for a semiconductor package and a semiconductor package using the member, and a method for fabricating the semiconductor package are provided to simply connect chip pads provided on a semiconductor chip to external terminals. With the member for the semiconductor package and the package using the member according to the present invention, the chip pads can simply be connected with the corresponding external terminals. In addition, since the electrical paths between the chip pads and the external leads are relatively shortened, thus the electric properties are improved. Further, since the external terminal balls can be arranged regardless of the location of the chip pads, the semiconductor package can be easily designed and the size of the package can approximate the chip size and the plurality of external balls can be provided. Also, since it is possible to perform the package process with either the wafer or the individual chip, an application range can be flexibly extended.

8 Claims, 5 Drawing Sheets

US 7,070,831 B2

MEMBER FOR SEMICONDUCTOR PACKAGE AND SEMICONDUCTOR PACKAGE USING THE SAME, AND FABRICATION METHOD THEREOF

This application is a Continuation of application Ser. No. 09/324,780 filed Jun. 3, 1999.

BACKGROUND OF THE INVENTION

1. Field of the Invention

The present invention relates to a member for a semiconductor package and a semiconductor package using the same, and more particularly to a member for a semiconductor package capable of connecting chip pads provided in the semiconductor chip to external terminals, and a semiconductor package using the above member which approximates the size of the semiconductor chip.

2. Description of the Conventional Art

One of the most general types among various kinds of semiconductor packages is formed such that a semiconductor chip is fixedly attached to paddles of a lead frame, pads of the chip are electrically connected with internal leads of the lead frame and the resultant structure is sealed by a molding resin.

FIG. 1 is a cross-sectional diagram illustrating a small outline J-lead (SOJ) semiconductor package, among conventional semiconductor packages, in which each outer leads has a "J" shape.

As shown therein, internal leads 3 of a lead frame are adherent to both sides of an upper surface of a semiconductor chip 1 by an adhesive 2, and chip pads 6 formed on a center portions of the upper surface of the chip 1 are connected with the internal leads 3 by virtue of wires 4 in an ultra-sound heat compression mode. The semiconductor chip 1 and the internal leads 3 are sealed by a molding resin 5, excluding outer leads 7. Then, the outer leads 7 are formed according to the purpose of a user. In the diagram, the external leads 7 are formed in the "J" shape.

However, the above conventional semiconductor package, in which electric signals from the chip pads 6 of the semiconductor chip 1 are supplied to external terminals of the package by using the internal and external leads 3, 7 of the lead frame, has a package size which is considerably larger than the semiconductor chip size and has relatively long electric paths between the chip pads 6 and the corresponding external leads 7, which results in deterioration of electric properties and difficult fabrication of a high-pin semiconductor package.

Accordingly, to make up for disadvantages of the conventional semiconductor package provided with the above-mentioned lead frame, various kinds of semiconductor packages have been developed and a chip size semiconductor package is one of the most improved semiconductor packages.

FIG. 2 is a perspective view of a ball grid array (BGA) semiconductor package of the chip size semiconductor packages.

With reference to FIG. 2, the conventional BGA semiconductor package is fabricated by, via a pre-assembly process, providing metal wires 13 for electrically connecting a plurality of chip pads 12 with corresponding internal-bump pads 17 which are provided on a semiconductor chip 11, attaching conductive internal bumps 16 on the corresponding internal-bump pads 17 which respectively have a tape (not shown) thereon, sealing the resultant semiconductor chip with a molding resin 14, exposing an upper surface of each internal bump 16 by removing the tape, applying solder paste and conductive external bumps 15 onto the internal bumps 16, and attaching the external bumps 15 to the corresponding internal bumps 16 through an infrared reflow process.

Further, FIG. 3 is a cross-sectional view of the conventional BGA semiconductor package shown in FIG. 2, wherein the chip pad 12 is arranged on the upper surface of the semiconductor chip 11, a protection film 18 for protecting the chip 12 is provided on the semiconductor chip 11 excluding an upper surface of the chip pad 12, the metal wire pattern 13 is provided on the protection film 18 including the chip pad 12 portion which is exposed, and one end of the metal wire 13 is connected with the chip pad 12 while the other end thereof to the internal-bump pad 17.

In addition to the above structure, on the above structure excluding the portion of the internal-bump pad 17 a polyimide film 19 is provided, the internal bump 16 is attached on the exposed pad 17 by a solder adhesive 20 such as Pb or Sn, the entire surface excluding the upper surface of the internal bump 16 is sealed by a molding resin 14 to cover the semiconductor chip 11, and the ball-type external bump 15 is attached onto the internal bump 16.

In the above BGA chip size semiconductor package, a bump pattern is provided on the semiconductor chip 11 to transfer an electric signal from the chip pad 12 to the external bump 15 by performing a separate pre-assembly process.

In other words, from the chip pad 12 to the internal-bump pad 17 of the semiconductor chip 11 the metal pattern 13 is formed for the electric connection therebetween, the conductive internal bump 16 is attached onto the internal-bump pad 17, then the resultant semiconductor chip 11 is sealed by the molding resin 14 and the external bump 15, serving as the external lead, is attached on the internal bump 16.

However, although the thusly provided BGA semiconductor package has a smaller package size to the chip size than the conventional semiconductor package shown in FIG. 1, it is required to have the internal and external bump attaching processes and the pre-assembly process which results in high-cost of the fabrication thereof.

SUMMARY OF THE INVENTION

Accordingly, the present invention is directed to a member for a semiconductor package which obviates the problems and disadvantages the conventional art.

An object of the present invention is to provide a member for a semiconductor package which facilitates the structure of a high-pin semiconductor package and simplifies the fabrication process by excluding an internal bump attaching process.

Another object of the present invention is to provide a chip size semiconductor package which is an ultra-thin size and a fabrication method thereof by applying the member for the semiconductor package.

To achieve these and other advantages and in accordance with the purpose of the present invention, as embodied and broadly described, the member for the semiconductor package is provided with an insulation film; predetermined conductive wire patterns formed to a lower surface of said insulation film; and first and second openings formed in the insulation film to at least partially expose the conductive patterns.

Further, a semiconductor package according to the present invention includes an insulation film; predetermined conductive wire patterns formed to a lower surface of said insulation film; first and second openings formed in the insulation film to at least partially expose the conductive patterns; a semiconductor chip wherein end portions of conductive wire patterns under the first openings are attached to corresponding chip pads provided on the chip; a filling material for sealing the first openings; and external terminals attached onto the corresponding conductive wire patterns which are exposed to the second openings.

In addition, a method for fabricating the semiconductor package includes forming predetermined conductive wire patterns to a lower surface of an insulation film; forming first and second openings at the insulation film to at least partially expose the conductive wire patterns; attaching end portions of the conductive wire patterns formed under the first openings to corresponding chip pads; filling the first openings with an filling material; and attaching external terminals onto the corresponding conductive wire patterns exposed to the second openings.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiment of the present invention, examples of which are illustrated in the accompanying drawings.

Figure 1:
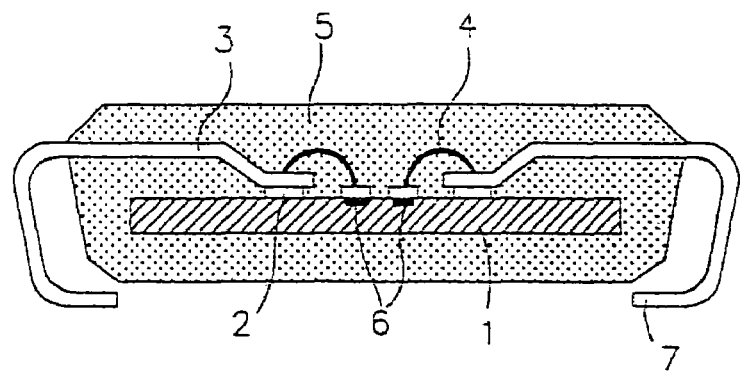
FIG. 1 is a cross-sectional diagram illustrating a conventional small outline J-lead (SOJ) semiconductor package.
Figure 2:
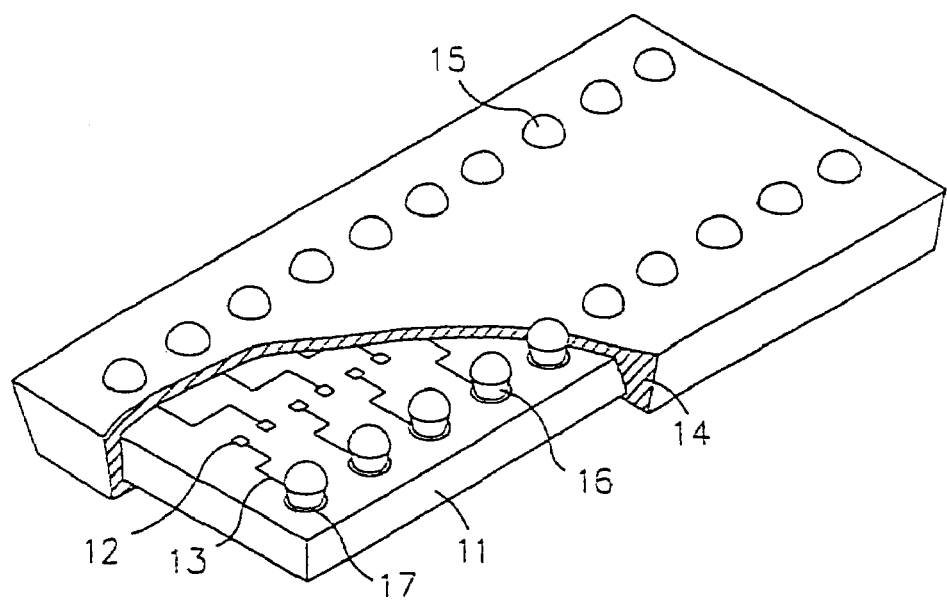
FIG. 2 is a perspective view of a conventional ball grid array (BGA) semiconductor package.
Figure 3:
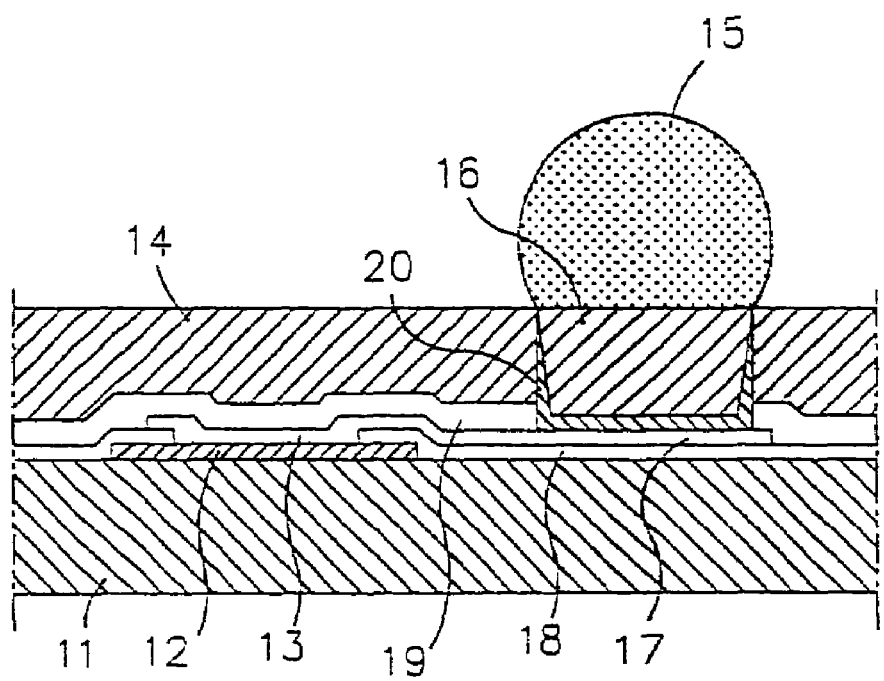
FIG. 3 is a cross-sectional diagram detailedly illustrating a bump electrode area in FIG. 2.
Figure 4A:
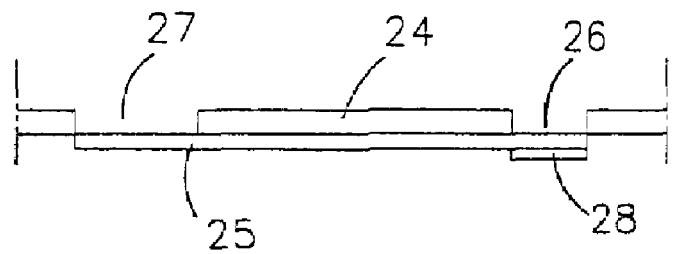
FIGS. 4A–4C are diagrams illustrating a member for a semiconductor package according to the present invention.
Figure 4B:
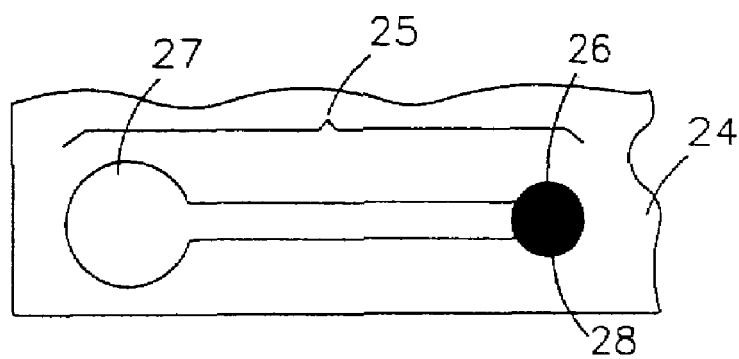
Figure 4C:
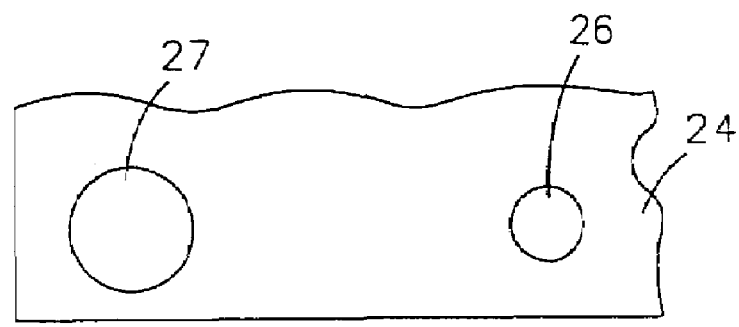

FIGS. 4A–4C illustrate a member for a semiconductor package according to the present invention, wherein FIG. 4A illustrates a vertical-cross sectional view of the member therefor, FIGS. 4B and 4C are top and bottom views of the member, respectively. As shown therein, the member for the semiconductor package is provided with a Cu pattern 25 in which a chip pad attaching portion 26 and an external terminal attaching portion 27 are formed on both ends thereof and a polyimide film 24 applied on an entire surface of a semiconductor chip by an adhesive, excluding the chip pad attaching portion 26 and the external terminal attaching portion 27, wherein the chip pad attaching portion 26 is to be connected with a chip pad of the semiconductor chip and the external terminal attaching portion 27 is to be connected with an external terminal.

Now, the process for fabricating the member for semiconductor package according to the present invention will be described in detail.

First, an adhesive is applied on a surface of the Cu film and the polyimide film 24 is formed thereon, while a Cu pattern 25 is formed at the other surface of the Cu film, at which the polyimide film 24 is not provided, as shown in FIG. 4B, wherein preferably diameters of the chip pad attaching portion 26 and the external attaching portion 27 are about 40 and 300 µm, respectively.

Here, it is noted that a process of forming an Au-plated film 28 on the chip pad attaching portion 26 of the Cu pattern 25 can be additionally provided in order to improve the adhesive strength between Al and Cu since the chip pad is formed of Al, in general, and the metal wire 25 is formed of Cu.

Then, after forming the Cu pattern 25, the fabricating process of the member for the semiconductor package according to the present invention is completed by patterning the other surface on which the polyimide film 24 is provided, as shown in FIG. 4C, to open the chip pad attaching portion 26 and the external terminal attaching portion 27.

There will be described a chip size semiconductor package and a fabrication method thereof using the thusly provided member for the semiconductor package.

Figure 5:
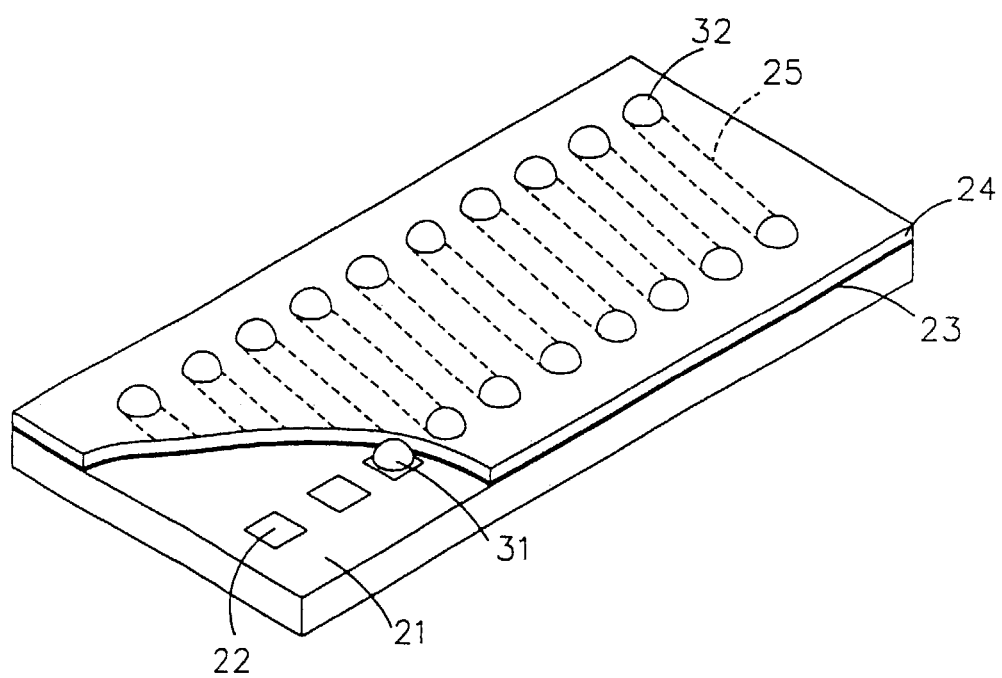
FIG. 5 is a perspective view of a semiconductor package according to an embodiment of the present invention.

FIG. 5 is a perspective view of a chip size semiconductor package according to an embodiment of the present invention.

As shown therein, in the chip size semiconductor package, an adhesive 23 is applied on the semiconductor chip 21 on which a plurality of chip pads 22 are provided, the above-described member for the semiconductor package is attached thereon, an epoxy 31 is filled in the chip pad attaching portion 26 formed in the member for the semiconductor package and a solder ball is provided on the external terminal attaching portion 27.

Now, with reference to FIGS. 6A–6G, there will be described the process for fabricating the chip size semiconductor package according to the embodiment of the present invention.

Figure 6A:
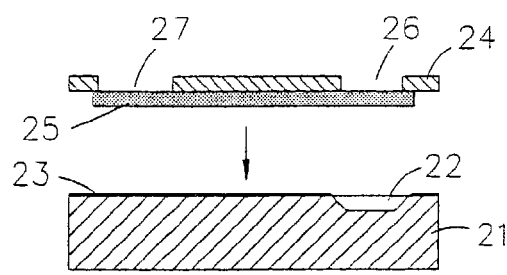
FIGS. 6A–6G are diagrams illustrating a fabrication process of the semiconductor package according to the embodiment of the present invention.
Figure 6B:
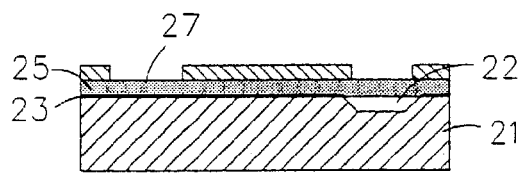

As shown in FIG. 6A, the adhesive 23 is applied on the upper surface of the semiconductor chip 21 on which the chip pad 22 is provided, and the member For the semiconductor package, wherein there is provided the Cu pattern 25 with the chip pad attaching portion 26 and the external terminal attaching portion 27 formed thereon and then the polyimide film 24 is applied thereon, is attached on the adhesive 23. FIG. 6B is a vertical-cross sectional diagram illustrating the semiconductor chip 21 attached to the member for the semiconductor package. Here, it is noted that an Au-plated film (not shown) can be applied on a portion where the member for the semiconductor package is to be attached to the chip pad 22 to intensify the adhesive strength.

Figure 6C:
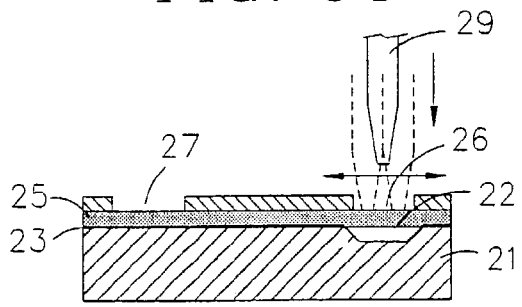
Figure 6D:
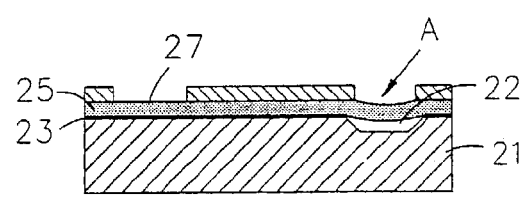

Then, as shown in FIG. 6C, when, using a bond tool 29, a direct pressure is applied to a portion where the chip pad 22 is to be attached to the chip pad attaching portion 26 by virtue of the ultra-sound heat compression process, the chip pad 22 becomes completely attached to the chip pad attaching portion 26 as shown in FIG. 6D.

Figure 6E:
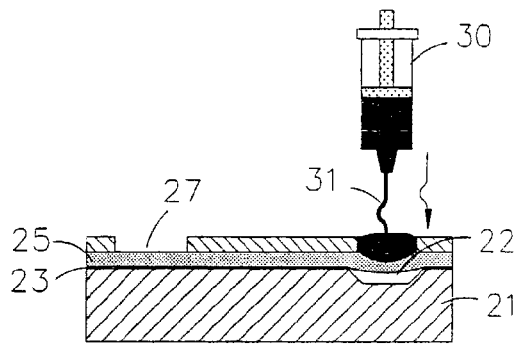
Figure 6F:
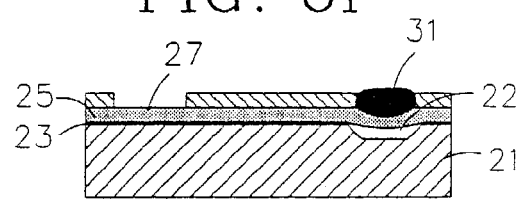

As shown in FIG. 6E, a space A provided thereafter is filled with a filling material such as an epoxy resin by using a cylinder 30 and then an external terminal which is electrically connected to the metal wire 25 is provided by performing an infrared reflow process after mounting a solder ball 32 on the corresponding external terminal attaching portion 27.

Figure 6G:
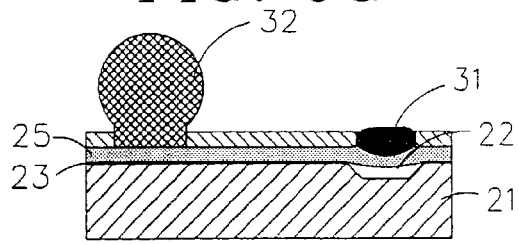

FIG. 6G is a vertical-cross sectional view of the semiconductor package after the above package process has been completed.

It is preferably noted that the package fabricating process for separating into individual semiconductor chips can be performed with a separate semiconductor chip after a sawing process, or the sawing process can be performed after performing the package process with a semiconductor wafer state.

As described above, the present invention has several advantages. First, the chip pads can simply be connected with the corresponding external terminals. In addition, since the electrical paths between the chip pads and the external leads are relatively shortened, thus the electric properties are improved. Further, since the external terminal balls can be arranged regardless of the location of the chip pads, the semiconductor package can be easily designed and the size of the package can approximate the chip size and the plurality of external balls can be provided. Also, since it is possible to perform the package process with either the wafer or the individual chip, an application range can be flexibly extended.

It will be apparent to those skilled in the art that various modifications and variations can be made in the member for the semiconductor package and semiconductor package using the member of the present invention without departing from the spirit or scope of the invention. Thus, it is intended that the present invention cover the modifications and variations of this invention provided they come within the scope of the appended claims and their equivalents.

What is claimed is:

1. A member for a semiconductor package, comprising:
   an insulation film;
   predetermined conductive wire patterns each having an upper surface formed to a lower surface of said insulation film;
   first openings formed in the insulation film to expose a portion of the upper surface of the conductive wire patterns;
   second openings formed in the insulation film to expose other portion of the upper surface of the conductive wire patterns;
   a metal-plated film disposed to a lower surface of the conductive wire patterns under the first openings, wherein the metal-plated film is attached to the conductive wire pattern by a direct pressure of an ultrasound heat compression; and
   a non-conductive filling material that covers the first opening over the exposed upper surface of the conductive wire patterns.

2. The member according to claim 1, wherein the metal-plated film is formed of Au.

3. The member according to claim 1, wherein the conductive wire patterns are formed of Cu.

4. The member according to claim 1, wherein a diameter of an end portion of each conductive wire pattern or each first opening is about 40 µm.

5. The member according to claim 1, wherein a diameter of the second opening or the conductive wire pattern provided under the second opening is about 300 µm.

6. The member according to claim 1, wherein said each of the conductive wire patterns are continuous, and wherein the first and second openings are discontinuous and separated by a prescribed distance over said each of the conductive wire patterns.

7. The semiconductor package according to claim 1, wherein the first and second openings are discontinuous and separated by a prescribed distance.

8. The semiconductor package according to claim 1, wherein said each of the predetermined conductive wire patterns are continuous.

* * * * *